United States Patent
Schwarzenbach

(10) Patent No.: US 10,903,263 B2
(45) Date of Patent: Jan. 26, 2021

(54) FRONT-SIDE TYPE IMAGE SENSOR AND METHOD FOR MANUFACTURING SUCH A SENSOR

(71) Applicant: Soitec, Bernin (FR)

(72) Inventor: Walter Schwarzenbach, Saint Nazaire les Eymes (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/340,879

(22) PCT Filed: Oct. 10, 2017

(86) PCT No.: PCT/EP2017/075797
§ 371 (c)(1),
(2) Date: Apr. 10, 2019

(87) PCT Pub. No.: WO2018/069310
PCT Pub. Date: Apr. 19, 2018

(65) Prior Publication Data
US 2019/0267425 A1    Aug. 29, 2019

(30) Foreign Application Priority Data
Oct. 10, 2016 (FR) ...................... 16 59763

(51) Int. Cl.
*H01L 27/146* (2006.01)
*H01L 21/762* (2006.01)

(52) U.S. Cl.
CPC .. *H01L 27/14687* (2013.01); *H01L 21/76251* (2013.01); *H01L 21/76254* (2013.01); *H01L 27/14601* (2013.01); *H01L 27/14643* (2013.01)

(58) Field of Classification Search
CPC ......... H01L 27/76251; H01L 27/14601; H01L 27/14643; H01L 21/76254; H01L 29/14608; H01L 27/14687
(Continued)

(56) References Cited

U.S. PATENT DOCUMENTS

2005/0074954 A1* 4/2005 Yamanaka ........ H01L 27/14643
438/458
2008/0083939 A1* 4/2008 Guidash .............. H01L 27/1464
257/292
(Continued)

FOREIGN PATENT DOCUMENTS

FR    3002812 B1    8/2016
WO    2010/018204 A1    2/2010

OTHER PUBLICATIONS

International Written Opinion for International Application No. PCT/EP2017/075797 dated Jan. 22, 2018, 5 pages.
(Continued)

*Primary Examiner* — Thinh T Nguyen
(74) *Attorney, Agent, or Firm* — TraskBritt

(57) ABSTRACT

A front-side type image sensor includes a substrate successively comprising a P− type doped semiconducting support substrate, an electrically insulating layer and a semiconducting active layer, and a matrix array of photodiodes in the active layer of the substrate, wherein the substrate comprises, between the support substrate and the electrically insulating layer, a P+ type doped semiconducting epitaxial layer A method of forming such a structure includes epitaxially growing a P+ type doped semiconducting layer on a P− type doped semiconducting support substrate, providing an electrically insulating layer and an active layer over the P+ type doped semiconducting layer, and forming photodiodes in the active layer.

11 Claims, 3 Drawing Sheets

(58) Field of Classification Search
USPC .... 438/48, 70, 458, 406, 455; 257/292, 290, 257/291, 77
See application file for complete search history.

(56) References Cited

U.S. PATENT DOCUMENTS

2011/0284870 A1* 11/2011 Le Tiec et al. ..... H01L 29/1608
257/77
2016/0118431 A1 4/2016 Dutartre

OTHER PUBLICATIONS

International Search Report for International Application No. PCT/EP2017/075797 dated Jan. 22, 2018, 4 pages.

* cited by examiner

FRONT-SIDE TYPE IMAGE SENSOR AND METHOD FOR MANUFACTURING SUCH A SENSOR

CROSS-REFERENCE TO RELATED APPLICATIONS

This application is a national phase entry under 35 U.S.C. § 371 of International Patent Application PCT/EP2017/075797, filed Oct. 10, 2017, designating the United States of America and published in English as International Patent Publication WO 2018/069310 A1 on Apr. 19, 2018, which claims the benefit under Article 8 of the Patent Cooperation Treaty to French Patent Application Serial No. 1659763, filed Oct. 10, 2016.

TECHNICAL FIELD

The present disclosure relates to a substrate for a "front-side" type image sensor, an image sensor incorporating such a substrate, and a method for manufacturing such a substrate.

BACKGROUND

U.S. Patent Application Publication Number US 2016/0118431 describes a "front-side" type image sensor (also called a "front-side imager").

As illustrated in FIG. 1, the sensor comprises a Semiconductor-On-Insulator (SOI) type substrate comprising, from its back side to its front side, a support substrate 1 of P+ doped silicon, an electrically insulating layer 2 of silicon oxide, and a active layer 3 called an active layer of P− doped silicon, wherein a matrix array of photodiodes each defining a pixel is defined.

By convention, a P− doping corresponds to a concentration of P type dopants (for example, boron) in the order of $10^{14}$ to a few $10^{15}$ at/cm$^3$.

A P+ doping corresponds to a concentration of P type dopants in the order of a few $10^{15}$ to $10^{19}$ at/cm$^3$.

The choice of a P+ type doped support substrate aims at minimizing the migration of electrons from the support substrate to the active layer, which is likely to originate a dark current corresponding to the generation of carriers in the photodiodes even in the absence of light. On the other hand, the support substrate can be biased at an electric voltage lower than that of the active layer, for causing a build-up of majority carriers of the active layer at the interface between the active layer 3 and the electrically insulating layer 2 of silicon oxide. The electrically insulating layer 2 of silicon oxide is intended to electrically insulate the active layer 3 from the support substrate 1, for the purpose of preventing electrons from passing from the support substrate to the active layer.

However, the implementation of a P+ doped substrate on an industrial manufacturing line of SOI substrates is of concern.

Indeed, in some manufacturing stations, for example during cleaning or heat treatment steps, boron diffusion out of the support substrate and scattering into the environment of the manufacturing line are observed.

But, the manufacturing line is generally not dedicated to a single type of SOI substrates, and can in particular lead to treat little or undoped substrates. However, boron diffused into the environment can lead to contamination of the substrate, and this diffusion does not allow an accurate control of their doping level, which can alter their electrical properties.

BRIEF SUMMARY

One purpose of the disclosure is to overcome the above-mentioned problem and to provide a "front-side" type image sensor comprising a substrate, which enables the dark current to be minimized without generating contamination problems on the manufacturing line of the substrate.

To that end, the disclosure provides a front-side type image sensor, including:
 a substrate successively comprising a P− type doped semiconducting support substrate, an electrically insulating layer and a semiconducting layer called an active layer, and
 a matrix array of photodiodes in the active layer of the substrate,
 wherein, the substrate comprises, between the support substrate and the electrically insulating layer, a P+ type doped semiconducting epitaxial layer.

As used herein, the term "front side" means the side of the image sensor intended to be exposed to a light radiation.

In the case where the support substrate would comprise a stack of different materials, as used herein, the term "material of the support substrate" means the material located on the front side thereof, such that growing the epitaxial layer is performed with the same lattice parameter (or sufficiently close to the same) as that of the underlying substrate.

According to one embodiment, the epitaxial layer is formed of the same semiconducting material as the support substrate.

In one particular implementation, the support substrate and the epitaxial layer are made of silicon.

According to one embodiment, the active layer is made of silicon.

Advantageously, the thickness of the electrically insulating layer is between 10 and 50 nm.

Preferably, the thickness of the epitaxial layer is between 0.1 and 3 µm.

In additional embodiments, the present disclosure includes a method for manufacturing a front-side type image sensor, comprising the steps of:
 providing a P− type doped semiconducting support substrate;
 epitaxially growing, on the support substrate, a P+ type doped semiconducting layer,
 providing a donor substrate comprising a superficial layer of semiconductor material;
 bonding the epitaxial layer to the layer of semiconductor material, an electrically insulating layer being located at the bonding interface;
 thinning the donor substrate so as to transfer a semiconducting active layer onto the support substrate; and
 forming a matrix array of photodiodes in the active layer of the substrate.

According to one embodiment, the method comprises a step of forming an embrittlement zone in the donor substrate so as to delimit the superficial layer, and thinning the donor substrate comprising detaching along the embrittlement zone.

In one implementation, forming the embrittlement zone comprises implanting atomic species in the donor substrate.

According to one embodiment, the method further comprises forming, about the epitaxial layer, a dopant diffusion barrier layer.

BRIEF DESCRIPTION OF THE DRAWINGS

Further characteristics and advantages of the disclosure will appear upon reading the detailed description that follows, in reference to the appended drawings in which.

For the sake of legibility of the figures, the different layers are not necessarily drawn to scale.

DETAILED DESCRIPTION

Figure 2:
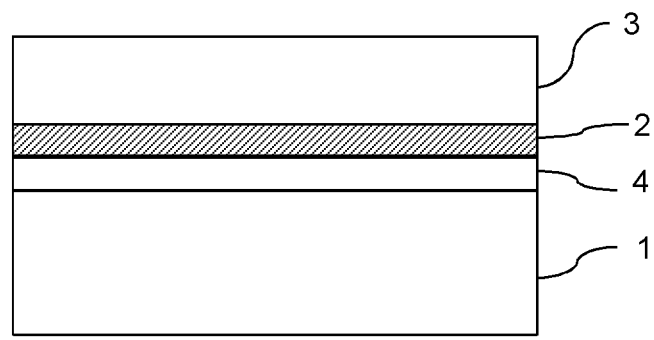
FIG. 2 is a cross-sectional view of a substrate in accordance with one embodiment of the disclosure.

FIG. 2 illustrates a substrate for a front-side image sensor according to one embodiment of the disclosure.

The substrate successively comprises, from its back side to its front side, a P− type doped semiconducting support substrate 1, a P+ type doped semiconducting epitaxial layer 4, an electrically insulating layer 2 and a semiconducting layer 3 called an active layer.

The active layer 3 is intended to receive a matrix array of photodiodes (not represented) enabling images to be sensed. Advantageously but not in a limiting way, active layer 3 can be made of silicon. In some embodiments, the active layer 3 can be slightly doped.

The support substrate 1 is generally obtained by cutting a P− doped single crystal ingot. Advantageously, the support substrate 1 is made of silicon.

The P+ type doped semiconducting layer 4 is formed on the support substrate 1 by epitaxy. In order to minimize defects in the epitaxial layer 4, the lattice parameter of the epitaxial layer 4 is close to the lattice parameter of the support substrate 1. Thus, the epitaxial layer is advantageously of the same material as the support substrate 1 (for example, of P+ doped silicon if the support substrate 1 is of P− doped silicon) or of another material (for example of P+ doped SiGe if the support substrate 1 is of P− doped silicon). Of course, these example embodiments are not limiting.

The thickness of the epitaxial layer 4 is advantageously between 0.1 and 3 µm, preferably between 0.1 and 1 µm.

The electrically insulating layer 2 sandwiched between the epitaxial layer 4 and the active layer provides an electrical insulation between the layers.

According to one preferred embodiment, the electrically insulating layer 2 is made of silicon oxide, but any other dielectric material could be suitable.

The thickness of the electrically insulating layer 2 is advantageously between 10 and 50 nm. Thus, as will be seen, it is possible to electrically bias the P+ doped layer at a voltage lower than that of the active layer 3, in order to cause build-up of majority carriers of the active layer at the interface between the active layer 3 and the electrically insulating layer 2 of silicon oxide.

Figure 1:
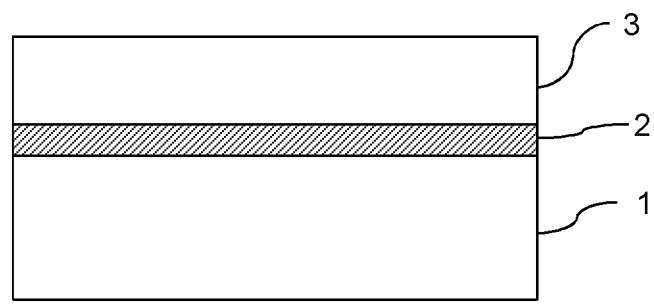
FIG. 1 is a cross-sectional view of a SOI substrate for a front-side image sensor as described in U.S. Patent Application Publication No. 2016/0118431.

In contrast to the known substrate illustrated in FIG. 1, wherein the part located at the rear of the layer of silicon oxide is fully P+ doped, the present disclosure provides a structure formed of two layers having different doping levels, that is the P+ doped epitaxial layer 4, which has a limited thickness, immediately at the rear of the electrically insulating layer 2, and the support substrate 1, which is substantially thicker than the epitaxial layer 4, at the rear of the epitaxial layer 4.

This two-part structure avoids, or at least reduces the contamination phenomenon resulting from diffusion of doping species off the substrate as previously discussed herein.

Indeed, the exposed area (that is in contact with the environment of the substrate) of the P+ doped material is substantially reduced in the embodiments of the present disclosure with respect to the configuration of the prior art. By way of example:

for a P+ doped support substrate of 30 cm diameter, 775 µm thickness and a chamfer of 1 mm width (corresponding to a substrate according to the prior art), the exposed area is equal to the sum of the area of the back side of the substrate, the side area of the substrate and the chamfer area, that is:

$$\Pi*15^2+2*\Pi*15*0.0775+\Pi*(15^2-14.9^2)=724\ cm^2$$

for a P+ doped epitaxial layer of 1 µm thickness formed on a P− doped substrate of 30 cm diameter and having a chamfer of 1 mm width (corresponding to one embodiment of the present disclosure), the exposed area is equal to the sum of the side area of the layer and the chamfer area, that is:

$$2*\Pi*15*0.0001+\Pi*(15^2-14.9^2)=9\ cm^2.$$

It is noted that since the substrates are not perfectly cylindrical but have a peripheral chamfer, the manufacture of a SOI substrate by layer transfer (for example by the SMART CUT® method described below) results in transferring a layer of a donor substrate onto the center part of the receiver substrate except for the chamfer thereof. In other words, the receiver substrate is not covered with the layer transferred into the chamfer region. To avoid complicating the figures, the chamfer is not illustrated in the figures.

In the example set out above, the exposed area of the P+ material is thus close to 80 to 100 times lower in the substrate according to the present disclosure than in the known substrate.

As a result, the doping species contained in the epitaxial layer 4 are likely to generate a much lower contamination than a bulk support substrate.

According to one embodiment not illustrated, it would be possible to further limit the diffusion of the doping species outwardly of the substrate by forming a barrier layer about the P+ doped epitaxial layer. Such a barrier layer can be in particular formed of the same material as the support substrate 1 or a material having a lattice parameter equivalent to that of the epitaxial layer 4 but without doping. However, the formation of such a barrier layer requires additional manufacturing steps which increase the period of time and complexity of the manufacturing method (for example lithography and etching step at the edge, including the chamfer zone or not).

A method for manufacturing a substrate for a front-side type image sensor according to the disclosure, using in particular the well-known SMART CUT® method will now be described in reference to FIGS. 3A to 3C.

Figure 3A:
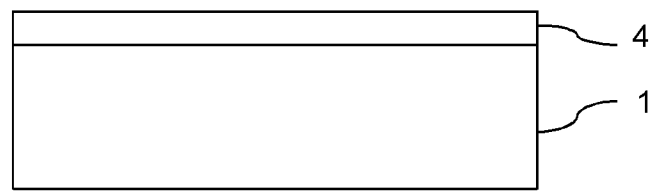
FIGS. 3A to 3C illustrate different steps of the method for manufacturing a substrate according to one embodiment of the disclosure.

In reference to FIG. 3A, the P+ doped support substrate 1 is provided, and the P+ doped epitaxial layer 4 is epitaxially grown until the desired thickness is achieved. A receiving structure is thus formed for transferring the active layer. The thickness of the epitaxial layer 4 depends on the doping level thereof: the higher the doping level (up to $10^{19}$ at/cm$^3$), the lower the thickness of this layer should be kept to avoid too strong a dissemination of the doping species off the substrate. The barrier layer mentioned before can contribute to keeping a predetermined thickness of the epitaxial layer 4 depending on the doping level contemplated as well as the heat treatments subsequently contemplated.

Figure 3B:

On the other hand, in reference to FIG. 3B, a donor substrate 30 comprising a superficial layer 31 of semiconductor material intended to form the active layer 3 of the SOI substrate is provided. The superficial layer is advantageously delimited by an embrittlement zone 32. According to one embodiment, the embrittlement zone 32 is formed by implanting atomic species, such as hydrogen and/or helium for example. Alternatively, the embrittlement zone can be a porous zone.

The superficial layer 31 of the donor substrate advantageously comprises an electrically insulating layer intended to form the buried electrically insulating layer 2 of the SOI substrate. This electrically insulating layer 2 can be an oxide of the material of the superficial layer 31. Optionally, such an electrically insulating layer can be present on the epitaxial layer 4 of the receiving structure, or even both on the donor substrate and the receiving structure.

Figure 3C:
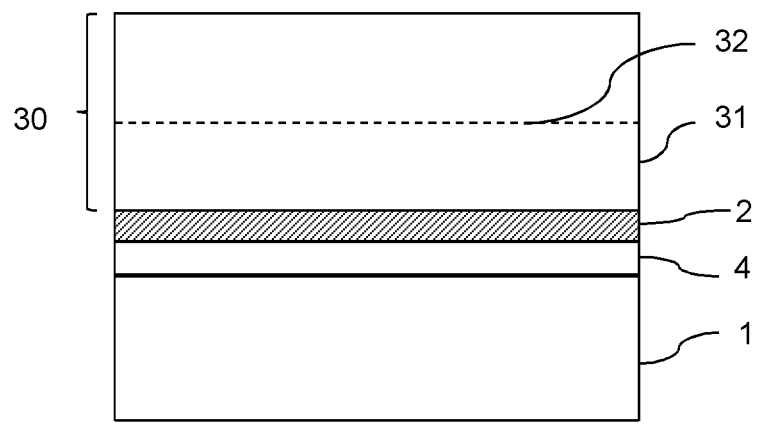

In reference to FIG. 3C, the donor substrate is bonded to the receiving structure, the electrically insulating layer(s) being at the bonding interface.

The applicant has checked that, although the formation of the epitaxial layer on the support substrate is likely to induce deformation of planarity of the receiving structure, the bonding quality between the donor substrate and the receiving structure remains suitable.

Then, the donor substrate 30 is thinned so as to transfer the superficial semiconducting layer 31 onto the support substrate 1. According to the SMART CUT® method, this thinning comprises detaching the donor substrate 30 along the embrittlement zone 32. After possible finishing steps, for example annealing, polishing and/or cleaning steps, the substrate illustrated in FIG. 2 is obtained.

According to one alternative (not represented), the donor substrate does not comprise any embrittlement zone and the transfer of the superficial layer onto the donor substrate is made by material removal by means of polishing the donor substrate through the face opposite to the bonding interface.

A matrix array of photodiodes is then made in the active layer 3. The manufacturing process of such an array of photodiodes is known by the skilled person and will thus not be described in more detail here.

Figure 4:
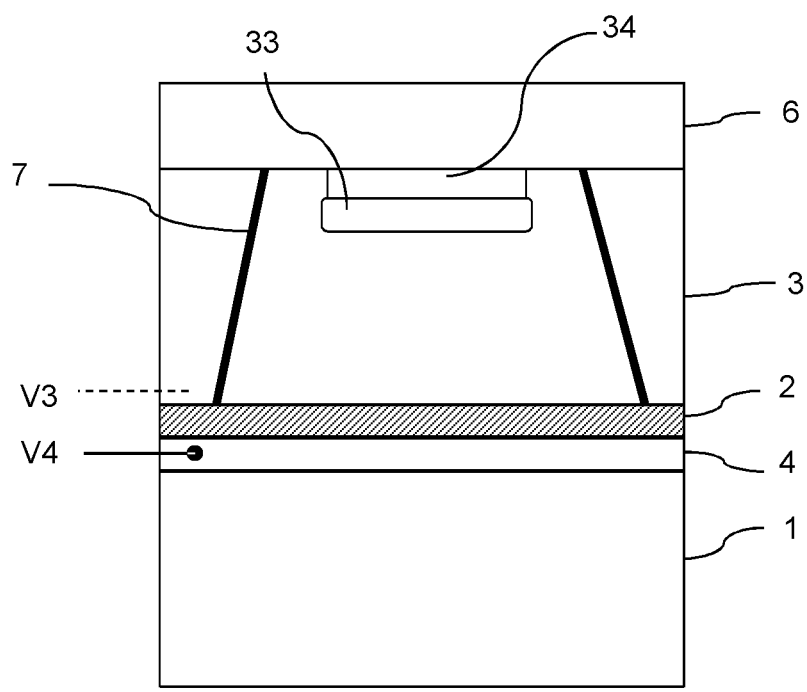
FIG. 4 is a cross-sectional view of a pixel of a "front-side" type image sensor comprising a substrate according to one embodiment of the disclosure.

FIG. 4 illustrates a part of a front-side type image sensor in accordance with the disclosure. Only a part of the sensor corresponding to a pixel is represented in this figure, the pixel being electrically insulated from the other pixels formed in the active layer 3 by insulation trenches 7.

An N− doped region 33 is formed under the surface of the front side of the active layer 3. This N− doped region forms a photodiode with the P− doped active layer 3. A region 34 formed between the N− doped region 33 and the front side of the active layer 3 has advantageously a doping level N higher than that of the N− doped region 33 in order to passivate the interface. A passivation layer 6 is formed on the active layer 3 and can encapsulate elements enabling the pixel to be electrically controlled.

Optionally, other layers, such as filters, can be formed on the passivation layer 6, but they are not represented in FIG. 4.

The structure of the image sensor as such and its manufacturing method are known to those skilled in the art and thus will not be described in further detail.

When the electrically insulating layer 2 is thin enough (in the order of 10 to 50 nm), thereby it plays the role of the dielectric element of a capacitor formed by the layers 3 and 4. Upon operating the image sensor, the active layer 3 is biased at an electric voltage which generally corresponds to the ground. The P+ doped epitaxial layer can advantageously be biased at a voltage V4 lower than the voltage of the active layer 3, V4 thus being negative. According to the same principle as that explained in U.S. Patent Application Publication Number 2016/0118431, the application of the negative voltage V4 induces build-up, at the interface between the electrically insulating layer 2 and the active layer 3, of majority carriers (holes) of the active layer 3. This charge build-up creates a positive electrical voltage V3 in the active layer 3 at the interface with the electrically insulating layer 2. The capacitor is thus subjected to a voltage difference V3−V4. The voltage V4 to be applied depends on the thickness of the electrically insulating layer 2.

Figure 5:
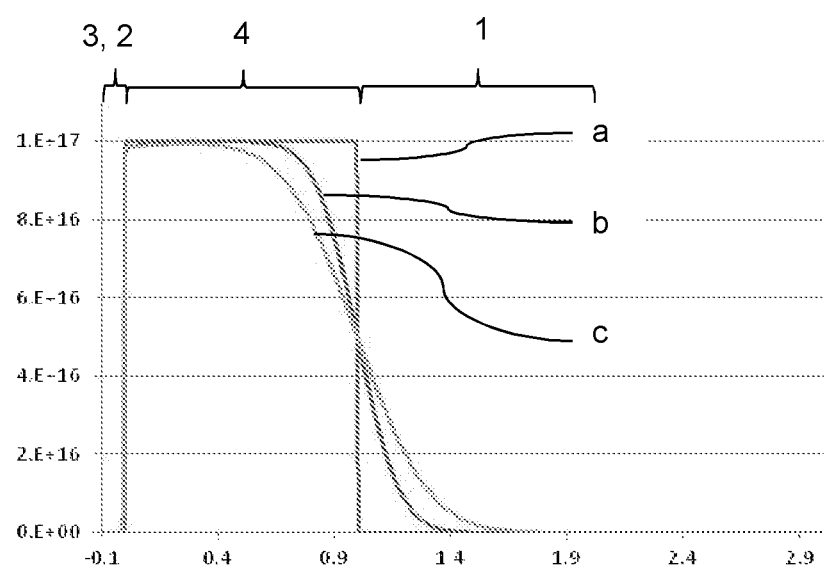
FIG. 5 illustrates simulations of the concentration of boron atoms in a substrate according to one embodiment of the disclosure, before applying a heat treatment (curve a) and after applying two usual heat treatments (curves b and c).

FIG. 5 illustrates simulations of the concentration of boron atoms in a substrate according to one embodiment of the disclosure, before applying a heat treatment (curve a) and after applying two usual heat treatments within the scope of the manufacture of one image sensor (curves b and c).

The abscissa axis indicates the depth (in μm) in the SOI substrate, the origin corresponding to the front side of the active layer (the marks 1 to 4 correspond to those of FIGS. 2 to 3C). The ordinate axis indicates the concentration (in atoms/cm$^3$) of boron atoms.

Curve a has the shape of a crenel which shows that the high boron concentration is limited to the epitaxial layer 4.

Curves b and c correspond to the same SOI substrate as that of curve a, but after applying two different heat treatments, that of curve c representing a heat budget higher than that of curve b. Both these curves show a light diffusion of boron atoms from epitaxial layer 4 to the underlying support substrate 1, but which remains limited. Consequently, the doping level of the epitaxial layer, and its effect on reducing the dark current, are maintained.

An additional barrier layer of the same type as mentioned before can be located between the support substrate 1 and the epitaxial layer 4 to avoid diffusion as mentioned above.

Another embodiment can include an epitaxial layer 4 having a predetermined doping gradient, this doping increasing to the front side in contact with the electrically insulating layer 2. Under the influence of heat treatment, the diffusion inside the epitaxial layer 4 having this gradient enables a sufficient average doping to be maintained for the application searched for.

The invention claimed is:

1. A method for manufacturing a front-side type image sensor, comprising:
   providing a P− type doped semiconducting support substrate;
   epitaxially growing a P+ type doped semiconducting layer on the support substrate;
   providing a donor substrate comprising a superficial layer of semiconductor material;

bonding the epitaxial layer to the superficial layer of semiconductor material, an electrically insulating layer being located at the bonding interface;

thinning the donor substrate so as to transfer a semiconducting active layer onto the support substrate; and forming a matrix array of photodiodes in the semiconducting active layer.

2. The method of claim 1, further comprising forming an embrittlement zone in the donor substrate so as to delimit the superficial layer, and wherein thinning the donor substrate comprises detaching the donor substrate from the superficial layer along the embrittlement zone.

3. The method of claim 2, wherein forming the embrittlement zone comprises implanting atomic species in the donor substrate.

4. The method of claim 3, further comprising forming, about the epitaxial layer, a dopant diffusion barrier layer.

5. The method of claim 1, further comprising forming, about the epitaxial layer, a dopant diffusion barrier layer.

6. The method of claim 1, further comprising forming the P+ type doped semiconducting layer and the support substrate to comprise the same semiconductor material.

7. The method of claim 6, further comprising forming the support substrate and the P+ type doped semiconducting layer comprise silicon.

8. The method of claim 1, further comprising forming the active layer to comprise silicon.

9. The method of claim 1, further comprising forming the electrically insulating layer to have a thickness between 10 and 50 nm.

10. The method of claim 1, further comprising forming the P+ type doped semiconducting layer to have thickness between 0.1 and 3 μm.

11. The method of claim 1, further comprising forming the active layer to comprise silicon, forming the electrically insulating layer to have a thickness between 10 and 50 nm, and forming the P+ type doped semiconducting layer to have thickness between 0.1 and 3 μm.

\* \* \* \* \*